US008779843B2

(12) United States Patent
Shioda

(10) Patent No.: US 8,779,843 B2
(45) Date of Patent: Jul. 15, 2014

(54) BIAS CIRCUIT

(75) Inventor: Tomoki Shioda, Gunma-ken (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 13/530,182

(22) Filed: Jun. 22, 2012

(65) Prior Publication Data

US 2012/0326755 A1  Dec. 27, 2012

(30) Foreign Application Priority Data

Jun. 24, 2011 (JP) ................................. 2011-140161

(51) Int. Cl.
*G05F 1/10* (2006.01)
(52) U.S. Cl.
USPC .......................................... 327/535; 327/109
(58) Field of Classification Search
USPC .................................. 327/109, 535
See application file for complete search history.

(56) References Cited

U.S. PATENT DOCUMENTS

| 6,897,729 | B1 * | 5/2005 | Jin et al. | 330/296 |
|---|---|---|---|---|
| 7,019,508 | B2 * | 3/2006 | Rategh et al. | 323/314 |
| 7,064,614 | B2 * | 6/2006 | Feng et al. | 330/296 |
| 7,262,666 | B2 * | 8/2007 | Luo | 330/296 |
| 7,332,968 | B2 * | 2/2008 | Luo | 330/296 |
| 7,345,547 | B2 * | 3/2008 | Wang et al. | 330/285 |
| 7,525,387 | B2 * | 4/2009 | Kazi et al. | 330/296 |
| 7,573,336 | B2 * | 8/2009 | Ishimaru et al. | 330/296 |
| 2006/0006947 | A1 * | 1/2006 | Feng et al. | 330/296 |
| 2007/0182488 | A1 * | 8/2007 | Imayama | 330/257 |
| 2012/0001690 | A1 * | 1/2012 | Wang | 330/254 |

FOREIGN PATENT DOCUMENTS

| JP | 8340224 A | 12/1996 |
|---|---|---|
| JP | 10335950 A | 12/1998 |

OTHER PUBLICATIONS

English Patent Abstract of JP 8340224 from esp@cenet, Publication Date: Dec. 24, 1996 (1 page).
English Patent Abstract of JP 10335950 from esp@cenet, Publication Date: Dec. 18, 1998 (1 page).

* cited by examiner

*Primary Examiner* — Ryan Jager
(74) *Attorney, Agent, or Firm* — Polansky & Associates, P.L.L.C.; Paul J. Polansky

(57) ABSTRACT

A bias circuit for an operating transistor has a first resistor disposed in a path for supplying a bias current to a base of the operating transistor, a first transistor for applying the bias current flowing to the first resistor, a second transistor for applying a corresponding current corresponding to the bias current supplied via at least one current mirror circuit, a third transistor having bases connected in common with the first transistor for applying the corresponding current, a second resistor for applying the corresponding current and obtaining a voltage drop corresponding to a voltage drop at the first resistor, and a fourth transistor receiving a reference voltage at an emitter side and having a base connected to an emitter side of the third transistor.

12 Claims, 5 Drawing Sheets

BIAS CIRCUIT

CROSS-REFERENCE TO RELATED APPLICATION(S)

The entire disclosure of Japanese Patent Application No. 2011-140161 filed on Jun. 24, 2011, including specification, claims, drawings, and abstract, is incorporated herein by reference in its entirety.

BACKGROUND

1. Technical Field

The present invention relates to a bias circuit for supplying a bias current to a base of an operating transistor.

2. Background Art

Heretofore, a differential amplifier or the like has a pair of differential transistors Q51 and Q52 with emitters connected in common as shown in FIG. 4 and connected to a constant current circuit. Then, the differential transistors Q51 and Q52 input a signal and are supplied with bias currents from a bias circuit to enable an operation in accordance with the input signal.

FIG. 4 includes a power supply V51 and resistors R51 and R52, where an output voltage of the power supply V51 is supplied as a bias voltage via the resistors R51 and R52 to bases of the differential transistors Q51 and Q52.

However, bipolar transistors have temperature dependent parameters, such as base-emitter voltage VBE and DC current gain $h_{FE}$. Therefore, when the bias circuit shown in FIG. 4 is used, the emitter voltages of the differential transistors Q51 and Q52 are temperature dependent.

Patent Document 1: Japanese Patent Laid-Open Publication No. Hei 8-340224

When operating an application with a relatively narrow dynamic range (D-range) over a wide temperature range, such as a mixer circuit or a circuit where low voltage operation is required, it is necessary to ensure dynamic range with temperature-independent operating points (emitter, collector voltages).

SUMMARY OF THE INVENTION

According to one or more embodiments of the present invention, a bias circuit for an operating transistor includes a first resistor arranged in a path for supplying a bias current to a base of the operating transistor, a first transistor for applying the bias current flowing to the first resistor, a second transistor for applying a corresponding current corresponding to the bias current via at least one current mirror circuit, a third transistor having bases connected in common with the first transistor for applying the corresponding current, a second resistor for applying the corresponding current and obtaining a voltage drop corresponding to a voltage drop at the first resistor, and a fourth transistor receiving a reference voltage at an emitter side and having a base connected to an emitter side of the third transistor, wherein 1VBE of the operating transistor is canceled by 1VBE of the fourth transistor and 1VBE of the second transistor is canceled by 1VBE of the third transistor thereby setting the reference voltage to an emitter side of the operating transistor.

According to one or more embodiments of the present invention, the first resistor is arranged between an emitter of the first transistor and the base of the operating transistor and arrange the second resistor between the emitter of the third transistor and the base of the fourth transistor.

According to one or more embodiments of the present invention, setting the emitter voltage of the operating transistor to a reference voltage enables the temperature dependence of the emitter voltage to be suppressed.

DETAILED DESCRIPTION

Embodiments of the present invention will be described hereinafter with reference to the attached drawings. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Figure 1:
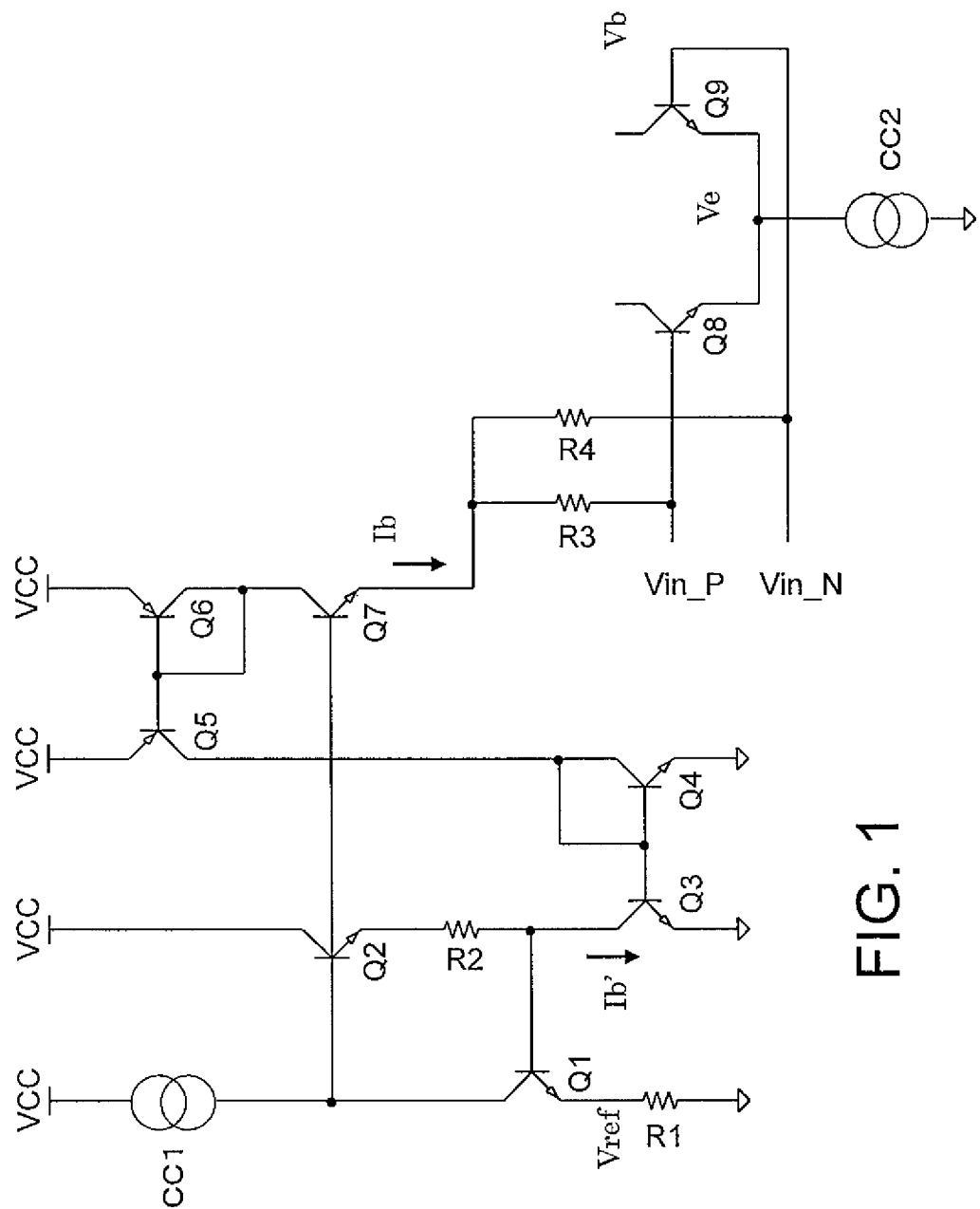
FIG. 1 shows a configuration of a bias circuit of an according to one or more embodiments of the present invention.

FIG. 1 shows a circuit configuration including a bias circuit according to one or more embodiments of the present invention.

NPN-type differential transistors Q8 and Q9 have emitters connected in common and connected to ground via a constant current circuit CC2. Here, Ve is the emitter voltage of the differential transistors Q8 and Q9. The differential transistors Q8 and Q9 are part of a differential amplifier and to bases of the differential transistors Q8 and Q9 are supplied a signal Vin_P and a signal Vin_N, which are a pair of complementary signals. Then, to the bases of the differential transistors Q8 and Q9 are supplied bias currents respectively via resistors R3 and R4.

A current value Ib, which is the sum of the currents flowing to the resistors R3 and R4, is a base current (bias current) of the differential transistors Q8 and Q9 when the signals Vin_P and Vin_N are absent. The current value Ib is basically determined by the resistance values R3 and R4 and set to an appropriate value (suitable bias current value for the differential amplifier) as required by the differential transistors Q8 and Q9.

The lower terminals of the resistors R3 and R4 are respectively connected to the differential transistors Q8 and Q9 and the upper terminals thereof are connected to a power supply VCC via transistors Q7 and Q6. Namely, an emitter of the PNP transistor Q6 is connected to VCC, a collector is connected to a collector of the NPN transistor Q7, and an emitter of the transistor Q7 is connected to the upper terminals of the resistors R3 and R4.

The transistor Q6 is shorted between the collector and base and to the base is connected a base of a PNP transistor Q5, which has an emitter connected to VCC. Therefore, the transistor Q6 and the transistor Q5 form a current mirror so that a current in accordance with (for example, identical to) the current flowing to the transistor Q6 flows to the transistor Q5.

To a collector of the transistor Q5 is connected a collector of an NPN transistor Q4, which has an emitter connected to ground. The transistor Q4 is shorted between the collector and base and to the base of the transistor Q4 is connected a base of an NPN transistor Q3, which has an emitter connected to ground. Therefore, the transistor Q4 and the transistor Q3 form a current mirror. The current flowing to the transistor Q5 flows to the transistor Q4 and a current Ib' in accordance with the current flowing to the transistor Q4 also flows to the transistor Q3. For example, if the emitter area of the transistor Q3 is N times that of the transistor Q4, the result is Ib'=N·Ib so that a current that is N times that of Ib flows to the transistor Q3.

A collector of the transistor Q3 is connected to an emitter of an NPN transistor Q2 via a resistor R2 and a collector of the NPN transistor Q2 is connected to VCC. Therefore, the same current as that to the transistor Q3 flows to the transistor Q2 and the resistor R2.

Furthermore, a collector of an NPN transistor Q1 is connected to the power supply VCC via a constant current circuit CC1 and an emitter of the transistor Q1 is connected to ground via a resistor R1.

Then, to a connection point between a collector of the transistor Q1 and the constant current circuit CC1 is connected bases of the transistor Q2 and the transistor Q7 and a base of the transistor Q1 is connected to a connection point between the resistor R2 and the collector of the transistor Q3.

Therefore, a constant current flowing to the constant current circuit CC1 flows to the resistor R1 and the upper side voltage of the resistor R1 is determined by a reference voltage Vref, which becomes the emitter voltage of the transistor Q1. As a result, the lower side voltage of the resistor R2 becomes the reference voltage Vref increased by 1VBE of the transistor Q1, or voltage Vref+1VBE. If the current flowing to the resistor R2 is Ib', the upper side voltage of the resistor R2 becomes Vref+1VBE+Ib'·R2. Then, the voltage Vref+1VBE+Ib'·R2 becomes the emitter side voltage of the transistor Q2 and the transistor Q7 and the emitter of the transistor Q7 is connected via the resistors R3 and R4 to the bases of the differential transistors Q8 and Q9 so that the voltage of the emitter of the differential transistors Q8 and Q9 is the voltage Vref+1VBE+Ib'·R2 minus the voltage drop of the resistor R3 or R4 decreased by 1VBE.

If the voltage drop at the resistor R2 and the respective voltage drops at the resistors R3 and R4 are equal, the 1VBE at the differential transistors Q8 and Q9 is compensated by 1VBE of the transistor Q1 so that the emitter voltage Ve of the differential transistors Q8 and Q9 becomes the reference voltage Vref, which is temperature independent.

Figure 5:
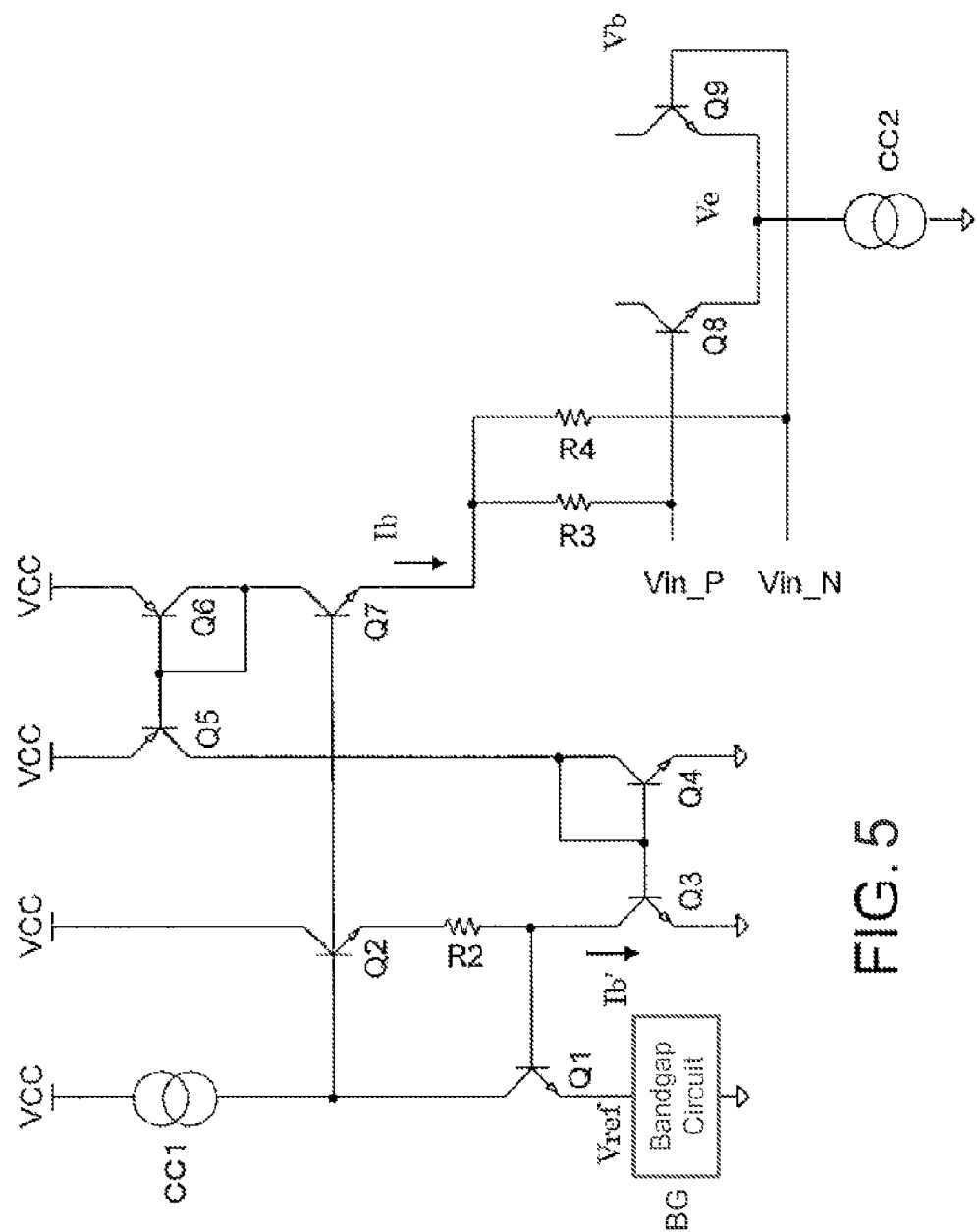
FIG. 5 shows a configuration of another bias circuit according to one or more embodiments of the present invention.

Namely, in the circuit of FIG. 1, the current Ib flowing to the transistor Q7 is transmitted by the current mirror circuit so that the current Ib' corresponding to Ib flows to the transistor Q2. Then, the voltage drop portion generated at the resistors R3 and R4 is canceled by the resistor R2. Therefore, if the VBE of the transistors Q1, Q2, Q7, Q8, and Q9 are equal, Vref=Ve results and the emitter voltage Ve of the differential transistors Q8 and Q9 can be made temperature independent. It should be noted Vref is easily made temperature independent by using, for example, a bandgap circuit, and such a circuit is shown in FIG. 5.

Here, a relationship of the resistors R2, R3, R4 and Ib and Ib' is shown next. Here, N indicates a current ratio of Ib and Ib'.

Expression 1

$$\frac{R3 \cdot R4}{R3 + R4} \cdot Ib = R2 \cdot Ib', \, N \cdot Ib = Ib' \quad (2\text{-}1)$$

Expression 2-1 can be arranged to yield expression 2-2. The expression indicates that R2 can be arbitrarily selected depending on the base bias resistors R3 and R4 and the current ratio N.

Expression 2

$$R2 = \frac{R3 \cdot R4}{N \cdot (R3 + R4)} \quad (2\text{-}2)$$

Here, the operation was confirmed by simulation regarding the bias circuit shown in FIG. 1. The simulation employs a commercially available simulation program using Abic, which is a time-series analysis program, and the parameters in expression 2-2 were respectively set as N=1, R2=10 kΩ, R3=20 kΩ, and R4=20 kΩ.

Figure 2:
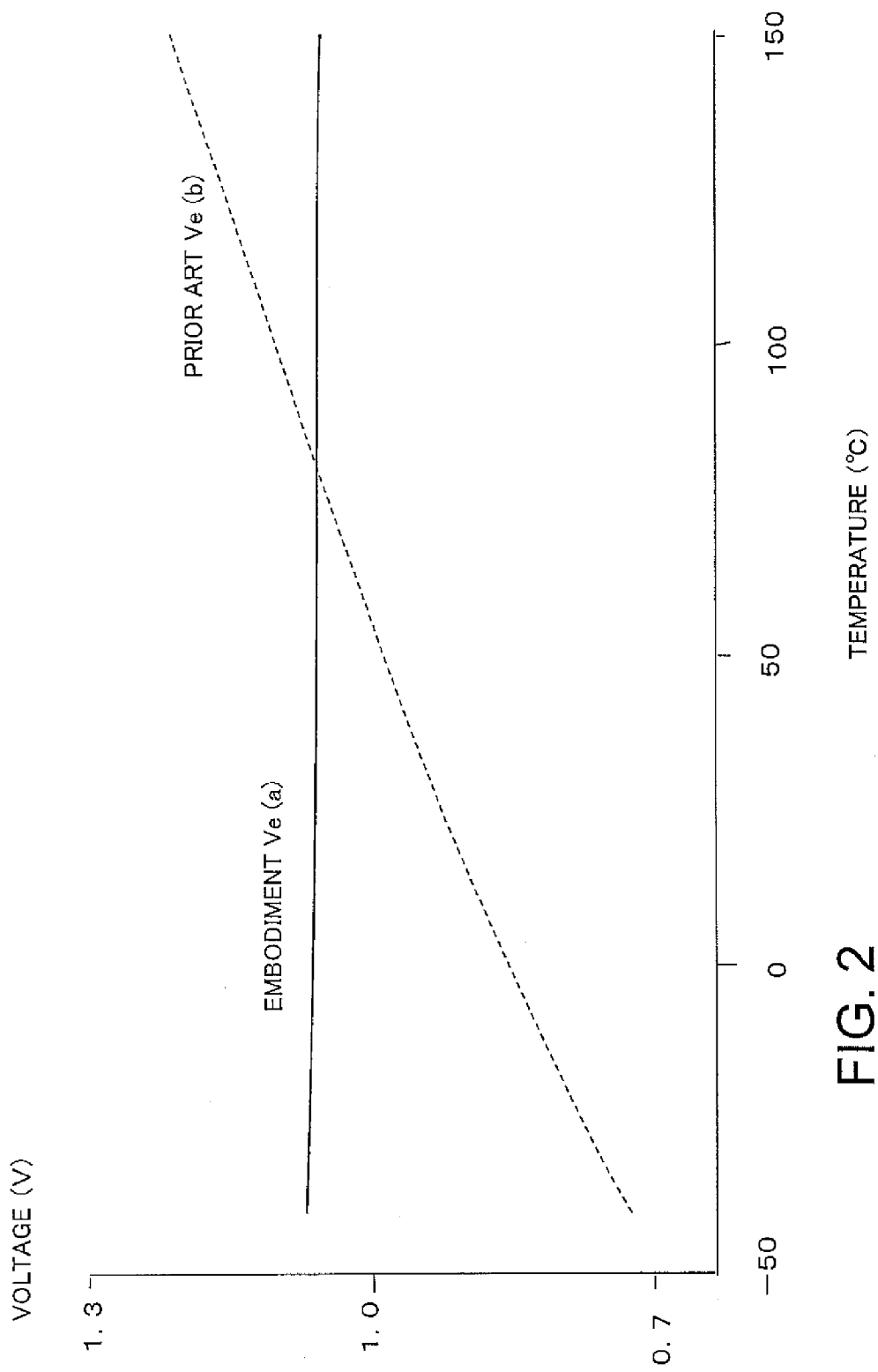
FIG. 2 shows a temperature characteristic of the bias circuit.
Figure 4:
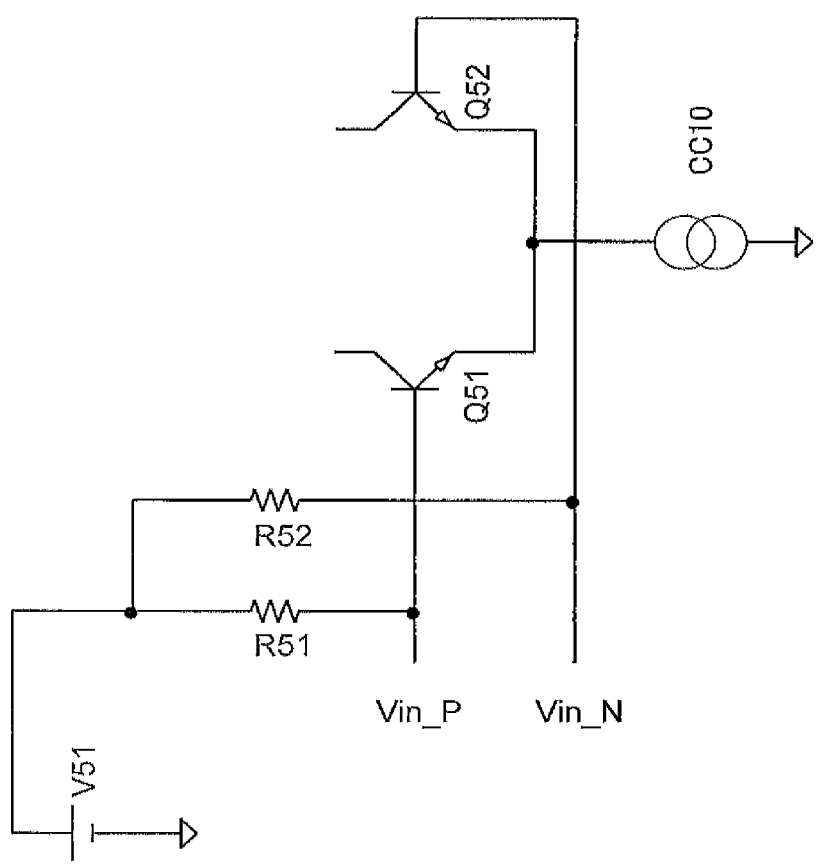
FIG. 4 shows a configuration of a conventional bias circuit.

FIG. 2 shows a simulation result at a temperature range of −50° C. to 150° C. The dotted line shown in the figure is the emitter voltage Ve of the differential transistor when a bias circuit of the prior art shown in FIG. 4 is used. In this manner, the emitter voltage Ve (b) fluctuates approximately 486 mV. On the other hand, the emitter voltage Ve (a) of the differential transistor when the bias circuit according to one or more embodiments of the present invention is used is shown as a solid line. In this case, the fluctuation is approximately 13 mV showing that the fluctuation is reduced considerably.

Figure 3:
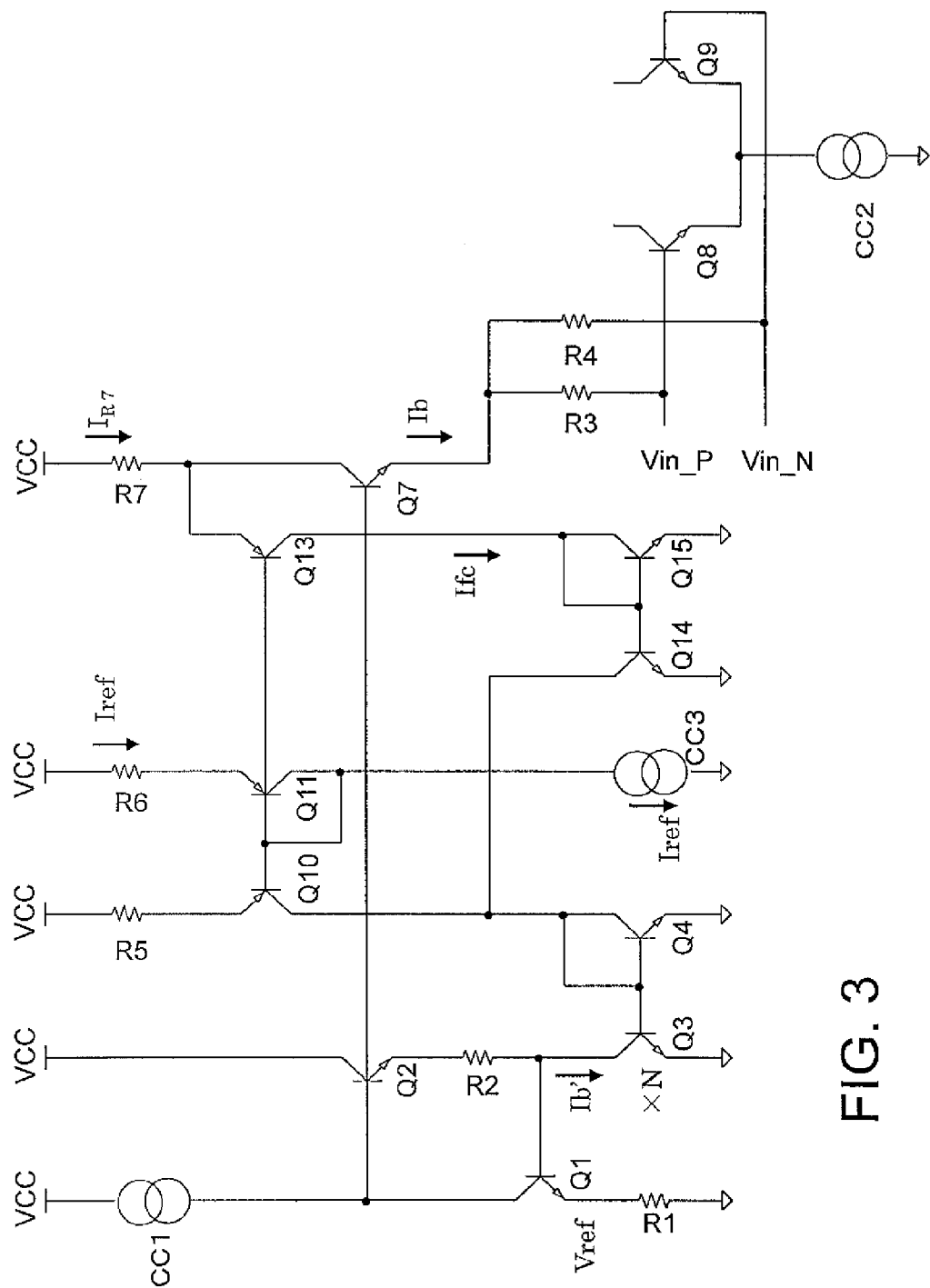
FIG. 3 shows a configuration of a bias circuit according to one or more embodiments of the present invention.

FIG. 3 shows an example modified circuit. The circuit of FIG. 3 is operational even when the power supply VCC is a lower voltage. Namely, by configuring the collector side of the transistor Q7 as a loopback current mirror circuit, the circuit is characterized by enabling operation at a lower voltage than the circuit shown in FIG. 1.

The collector of the transistor Q7 is connected to VCC via a resistor R7. Then, an emitter of a PNP transistor Q13 is connected to a connection point between the collector of the transistor Q7 and the resistor R7 and a collector of an NPN transistor Q15, which has an emitter connected to ground, is connected to a collector of the transistor Q13. The transistor Q15 is shorted between the collector and a base and to the base is connected a base of an NPN transistor Q14, which has an emitter connected to ground. Therefore, the transistors Q15 and Q14 form a current mirror. Then, a collector of the transistor Q14 is connected to the collector of the transistor Q4.

To the collector of the transistor Q4 is connected a collector of a PNP transistor Q10 and an emitter of the transistor Q10 is connected to VCC via the resistor R5.

Furthermore, to the power supply VCC is connected an emitter of a PNP transistor Q11 via a resistor R6 and a collector of the transistor Q11 is connected to ground via a constant current circuit CC3, which applies a constant current Iref. The transistor Q11 is shorted between the collector and a base and the base is connected to a base of the transistor Q10. Furthermore, to the base of the transistor Q11 is also connected in common a base of the transistor Q13.

In this circuit, a voltage $V_{R7}$ across the terminals of the resistor R7 is derived from the following expression. Namely, since the constant current Iref, which flows to the constant current circuit CC3, flows to the resistor R6, the voltage drop $V_{R7}$ at the resistor R7 becomes a voltage where the voltage drop Iref·R6 of the resistor R6 is subtracted from VCC, a base emitter voltage VBE11 of the transistor Q11 is further subtracted, and a base emitter voltage VBE13 of the transistor Q13 is added. The current flowing to the transistor Q13 is set as Ifc. Furthermore, Is is the saturation current and $V_T$ is the thermal voltage.

Expression 3

$$V_{R7} = Vcc - (Vcc - Iref \cdot R6 - V_{BE11} + V_{BE13}) \quad (3\text{-}1)$$
$$= Iref \cdot R6 + V_T \cdot \ln(Iref/(Is)) - V_T \cdot \ln(Ifc/(Is))$$
$$= Iref \cdot R6 + V_T \cdot \ln(Iref/Ifc)$$

Furthermore, with current $I_{R7}$ flowing to the resistor R7, Ib' is derived from the following expression. Here, the current ratio of transistors Q3:Q4 is N (the current flowing to the transistor Q3 is N times the current flowing to the transistor Q4).

Expression 4

$$Ifc + Ib = I_{R7} = \frac{V_{R7}}{R7} = \frac{R6}{R7} Iref + V_T \cdot \frac{\ln(Iref/Ifc)}{R7} \quad (3\text{-}2)$$
$$Ifc = \frac{R6}{R7} Iref + V_T \cdot \frac{\ln(Iref/Ifc)}{R7} - Ib$$
$$Ib' = N\left(Iref - \left(\frac{R6}{R7} Iref + V_T \cdot \frac{\ln(Iref/Ifc)}{R7} - Ib\right)\right)$$

Here, setting R6=R7 and Iref/Ifc≈1, Ib' is expressed as follows.

Expression 5

$$Ib' = N \cdot Ib \quad (3\text{-}3)$$

In this manner, expression 3-3 is the same as expression 2-1 showing that the same operation as that of the bias circuit shown in FIG. 1 can also be obtained from the bias circuit shown in FIG. 3.

According to the circuit of FIG. 3, only one transistor, transistor Q7, is found between the transistors Q8 and Q9 and the power supply VCC. Therefore, operation becomes possible even when the power supply VCC becomes a low voltage.

Although a PNP transistor, which has a collector connected to the power supply VCC, is used here in the constant current circuit CC1, the voltage drop at the PNP transistor is the emitter-collector voltage and this voltage drop can be decreased considerably. Then, the voltage at the base of the transistor Q7, lowered by an amount of 1 VBE of the transistor Q7 can be set to the upper voltage of the resistors R3 and R4 to enable the circuit to be operational even when the voltage of the power supply VCC drops.

In this manner, according to the bias circuit according to one or more embodiments of the present invention, the temperature dependency of the emitter voltage of the differential transistors Q8 and Q9 can be suppressed to a low level. As an example, the capability of limiting the emitter voltage to a fluctuation of 13 mV or less across a temperature range of −50° C. to 150° C. was demonstrated. Therefore, in a mixer or a circuit where low voltage operation is required, it becomes possible to ensure dynamic range with temperature-independent operating points and operation across a wide temperature range.

Furthermore, by adopting the configuration of FIG. 3, the circuit also becomes suitable for instances where low voltage operation is required.

While embodiments of the present invention are described, it will be understood that various modifications may be made thereto, and it is intended that the appended claims cover all such modifications as fall within the true spirit and scope of the invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A circuit comprising:
   a first current source having a first terminal coupled to a first power supply voltage terminal, and a second terminal, the first current source being a constant current source;
   a first transistor having a collector coupled to the second terminal of the first current source, a base, and an emitter;
   a first resistor having a first terminal coupled to the emitter of the first transistor, and a second terminal coupled to a second power supply voltage terminal;
   a second transistor having a collector coupled to the first power supply voltage terminal, a base coupled to the second terminal of the first current source, and an emitter;
   a second resistor having a first terminal coupled to the emitter of the second transistor, and a second terminal coupled to the base of the first transistor;
   an output transistor having a collector, a base coupled to the second terminal of the first current source, and an emitter for providing a bias current; and
   a current mirror circuit having an input terminal coupled to the second terminal of the second resistor, and an output terminal coupled to the collector of the output transistor, for providing a current proportional to a current at the second terminal of the second resistor to the collector of the output transistor.

2. The circuit of claim 1 wherein the current mirror circuit comprises:
   a first current mirror having an input coupled to the second terminal of the second resistor, and an output terminal; and
   a second current mirror having an input coupled to the output of the first current mirror, and an output coupled to the collector of the output transistor.

3. The circuit of claim 2 wherein the first current mirror comprises:
   a third transistor having a first current electrode, a control electrode, and a second current electrode coupled to the second power supply voltage terminal; and
   a fourth transistor having first current electrode for providing the output of the first current mirror, a control electrode coupled to the first current electrode thereof and to the control electrode of the second transistor, and a second current electrode coupled to the second power supply voltage terminal.

4. The circuit of claim 3 wherein the first and second transistors comprise bipolar transistors.

5. The circuit of claim 2 wherein the second current mirror comprises:
   a fifth transistor having a first current electrode coupled to the first power supply voltage terminal, a control electrode, and a second current electrode providing the input of the second current mirror; and
   a sixth transistor having first current electrode coupled to the first power supply voltage terminal, a control electrode coupled to the control electrode of the fifth transistor, and a second current electrode providing the output of the second current mirror.

6. The circuit of claim 5 wherein the fifth and sixth transistors comprise bipolar transistors.

7. The circuit of claim 2 further comprising a differential amplifier circuit coupled to the emitter of the output transistor for receiving the bias current.

8. The circuit of claim 7 wherein the differential amplifier circuit comprises:
- a third resistor having a first terminal coupled to the output of the current mirror circuit, and a second terminal;
- a fourth resistor having a first terminal coupled to the output of the current mirror circuit, and a second terminal;
- a first amplifier transistor having a collector coupled to the second terminal of the third resistor, a base for receiving a first differential input signal, and an emitter;
- a second amplifier transistor having a collector coupled to the second terminal of the fourth resistor, a base for receiving a second differential input signal, and an emitter coupled to the emitter of the first amplifier transistor; and
- a second current source having a first terminal coupled to the emitters of the first amplifier transistor and the second amplifier transistor, and a second terminal coupled to the second power supply terminal.

9. A method for biasing first and second amplifier transistors of a differential amplifier that have respective emitters coupled together, comprising:
- establishing a reference voltage using a first resistor;
- increasing the reference voltage by a base-to-emitter voltage of a first transistor to form a second voltage;
- increasing the second voltage by a first bias current times a resistance of a second resistor to form a third voltage;
- increasing the third voltage by a base-to-emitter voltage of a second transistor to form a fourth voltage;
- biasing a base of an output transistor with the fourth voltage;
- providing a second current to a collector of the output transistor proportional to the first bias current, wherein providing the current to the collector of the output transistor proportional to the first bias current comprises:
- coupling a collector of the second transistor to a power supply voltage terminal; and
- mirroring a current out of a node coupled to a second terminal of the second resistor and a base of the first transistor to the collector of the output transistor;
- coupling a third resistor between the emitter of the output transistor and a base of the first amplifier transistor; and
- coupling a fourth resistor between the emitter of the output transistor and a base of the second amplifier transistor, thereby establishing a temperature independent voltage corresponding to the reference voltage at the emitters of the first and second amplifier transistors.

10. The method of claim 9 wherein establishing the reference voltage comprises:
- generating a constant current; and
- providing the constant current to a first terminal of the first resistor to establish the reference voltage.

11. The method of claim 9 wherein establshing the reference voltage comprises:
- establishing the reference voltage using a bandgap circuit.

12. The method of claim 9 further wherein:
- the increasing the reference voltage by the base-to-emitter voltage of the first transistor comprises increasing the reference voltage by a first amount equal to a base-to-emitter voltage drop of the first amplifier transistor; and
- the increasing the third voltage by the base-to-emitter voltage of a second transistor comprises increasing the third voltage by a second amount equal to a base-to-emitter drop of the output transistor.

\* \* \* \* \*

UNITED STATES PATENT AND TRADEMARK OFFICE
CERTIFICATE OF CORRECTION

| | |
|---|---|
| PATENT NO. | : 8,779,843 B2 |
| APPLICATION NO. | : 13/530182 |
| DATED | : July 15, 2014 |
| INVENTOR(S) | : Tomoki Shioda |

Page 1 of 1

It is certified that error appears in the above-identified patent and that said Letters Patent is hereby corrected as shown below:

In the Specification

Column 2, lines 8 to 9, replace "circuit of an according" with "circuit according".

Signed and Sealed this
Twenty-first Day of October, 2014

Michelle K. Lee
*Deputy Director of the United States Patent and Trademark Office*